United States Patent
Porter et al.

(10) Patent No.: US 9,368,184 B2
(45) Date of Patent: *Jun. 14, 2016

(54) MEMORY REFRESH METHODS, MEMORY SECTION CONTROL CIRCUITS, AND APPARATUSES

(71) Applicant: Micron Technology, Inc., Boise, ID (US)

(72) Inventors: John David Porter, Meridian, ID (US); Gi-Hong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/505,717

(22) Filed: Oct. 3, 2014

(65) Prior Publication Data

US 2015/0023121 A1    Jan. 22, 2015

Related U.S. Application Data

(63) Continuation of application No. 14/084,417, filed on Nov. 19, 2013, now Pat. No. 8,861,296, which is a continuation of application No. 13/217,070, filed on Aug. 24, 2011, now Pat. No. 8,588,022.

(51) Int. Cl.
| | |
|---|---|
| *G11C 7/00* | (2006.01) |
| *G11C 11/402* | (2006.01) |
| *G11C 8/08* | (2006.01) |
| *G11C 8/10* | (2006.01) |
| *G11C 11/406* | (2006.01) |
| *G11C 11/408* | (2006.01) |
| *G11C 5/14* | (2006.01) |

(52) U.S. Cl.
CPC .............. *G11C 11/402* (2013.01); *G11C 5/147* (2013.01); *G11C 8/08* (2013.01); *G11C 8/10* (2013.01); *G11C 11/406* (2013.01); *G11C 11/4085* (2013.01); *G11C 2211/4065* (2013.01); *G11C 2211/4067* (2013.01)

(58) Field of Classification Search
CPC ...................... G11C 11/406; G11C 2211/4067; G11C 5/147; G11C 11/4076; G11C 11/4085; G11C 11/402
USPC ................... 365/222, 230.06, 230.03, 230.08
See application file for complete search history.

(56) References Cited

U.S. PATENT DOCUMENTS

| | | | |
|---|---|---|---|
| 5,940,342 A | 8/1999 | Yamazaki et al. | |
| 7,359,271 B2 | 4/2008 | Schneider et al. | |
| 7,379,323 B2 * | 5/2008 | Miyamoto et al. ............ 365/222 |

(Continued)

*Primary Examiner* — David Lam
(74) *Attorney, Agent, or Firm* — Dorsey & Whitney LLP

(57) ABSTRACT

Apparatuses, memory section control circuits, and methods of refreshing memory are disclosed. An example apparatus includes a plurality of memory sections and a plurality of memory section control circuits. Each memory section control circuit is coupled to a respective one of the plurality of memory sections and includes a plurality of access line drivers, each of which includes a plurality of transistors having common coupled gates. During an operation of the apparatus a first voltage is provided to the commonly coupled gates of the transistors of at least some of the access line drivers of the memory section control circuit coupled to an active memory section and a second voltage is provided to the commonly coupled gates of the transistors of the access line drivers of the memory section control circuit coupled to an inactive memory section control circuit, wherein the first voltage is greater than the second voltage.

20 Claims, 5 Drawing Sheets

(56) References Cited

U.S. PATENT DOCUMENTS

| | | |
|---|---|---|
| 7,447,098 B2 | 11/2008 | Tsukude |
| 7,564,736 B2 | 7/2009 | Kobayashi |
| 7,593,272 B2 | 9/2009 | Doyle et al. |
| 7,626,862 B2 | 12/2009 | Matsubara |
| 8,588,022 B2 * | 11/2013 | Porter et al. ......... 365/222 |
| 8,861,296 B2 * | 10/2014 | Porter et al. ......... 365/222 |
| 2013/0051171 A1 | 2/2013 | Porter et al. |
| 2014/0078847 A1 | 3/2014 | Porter |

* cited by examiner

MEMORY REFRESH METHODS, MEMORY SECTION CONTROL CIRCUITS, AND APPARATUSES

CROSS REFERENCE TO RELATED APPLICATION(S)

This application is a continuation of U.S. patent application Ser. No. 14/084,417, filed Nov. 19, 2011 issued as U.S. Pat. No. 8,861,296 on Oct. 14, 2014 is a continuation of U.S. patent application Ser. No. 13/217,070, filed Aug. 24, 2011, and issued as U.S. Pat. No. 8,588,022 on Nov. 19, 2013. These applications and patents are incorporated herein by reference, in their entirety, for any purpose.

TECHNICAL FIELD

Embodiments of the present invention relate generally to volatile semiconductor memory, and more particularly in one or more of the illustrated embodiments, to reduction of power consumption in memory devices by regulating a word line driver voltage during self-refresh operations.

BACKGROUND OF THE INVENTION

Contemporary memory devices typically include an array of memory cells arranged in rows and columns. Memory cells of each row are accessed by activating a corresponding access line often referred to as a word line. The word line may be activated by a word line driver responsive to decoding a corresponding row address with a row address decoder.

Word line drivers typically comprise a p-channel field effect transistor (pFET) and an n-channel field effect transistor (nFET) coupled together at their respective drains and gates, forming a complementary FET output stage coupled to the word line at the drains of the transistors. The source of the pFET can be configured to receive, for example, a phase signal (e.g., from a phase decoder). Meanwhile, the source of the nFET can be configured to receive, for example, a deactivated word line voltage (e.g., VNEGWL). Assuming a sufficiently high voltage phase signal (e.g., VCCP, which may be a pumped supply voltage) is provided as the phase signal to the source of its word line driver, a word line may be activated by providing a sufficiently low voltage (e.g., ground) to the gate of the pFET to turn on the pFET and pull the word line up to ~VCCP. To quickly deactivate the word line (e.g., to close the row), as is typically desired after a row of memory cells has been accessed (e.g., refreshed), a sufficiently high voltage (e.g., VCCP) is provided to the gate of the nFET to quickly turn on the nFET and pull the word line down to ~VNEGWL.

A performance issue associated with the use of such a word line driver is gate-induced diode leakage (GIDL) current. GIDL currents may arise when the pFET of a word line driver experiences a relatively significant gate-to-drain voltage such that current leaks from the nwell to the drain of the pFET when the transistor is operating in an "off" state. Since the gates of the pFET and nFET transistors are coupled together in such a word line driver, this can occur when VCCP is being provided to the gate of the nFET (and thus also to the gate of the pFET). Because numerous word line drivers may be used simultaneously in a memory system, GIDL current can result in substantial unwanted power consumption, even in inactive sections of memory.

Some design considerations have been implemented in an attempt to mitigate power consumption resulting from GIDL currents. One method involves reducing the voltage being provided to the gate of the nFET after the word line has been deactivated, such as by discharging the voltage being provided to the gate of the nFET down to VCC (where VCC may be a common supply voltage) after deactivating the word line. In some embodiments, the VCCP voltage is greater than the VCC voltage by about 2 volts, for example (e.g., the VCC voltage may be about 1.2 volts and the VCCP voltage may be about 3.2 volts). The VCCP and VCC voltages may have other voltage magnitudes as well, and may also have different voltage differences.

The aforementioned method to mitigate power consumption resulting from GIDL current requires charging/discharging the voltage on a node (Vccprdec) of a memory section control circuit between VCC and VCCP. During some memory operations, for example, a self-refresh operation, rows of memory are typically sequentially accessed, causing repeated charging and discharging of the Vccprdec node as the rows of an active section of memory are refreshed. Like GIDL currents, this frequent charging and discharging between the reduced voltage and the increased voltage can lead to unwanted consumption of current.

Therefore, a need exists for a method and system to refresh memory cells that may decrease power consumption resulting from GIDL currents.

DETAILED DESCRIPTION

Certain details are set forth below to provide a sufficient understanding of embodiments of the invention. However, it will be clear to one having ordinary skill in the art that embodiments of the invention may be practiced without these particular details. Moreover, the particular embodiments of the present invention described herein are provided by way of example only and should not be used to limit the scope of the invention to these particular embodiments. In other instances, well-known circuits, control signals, timing protocols, and software operations have not been shown in detail in order to avoid unnecessarily obscuring the invention.

Figure 1:
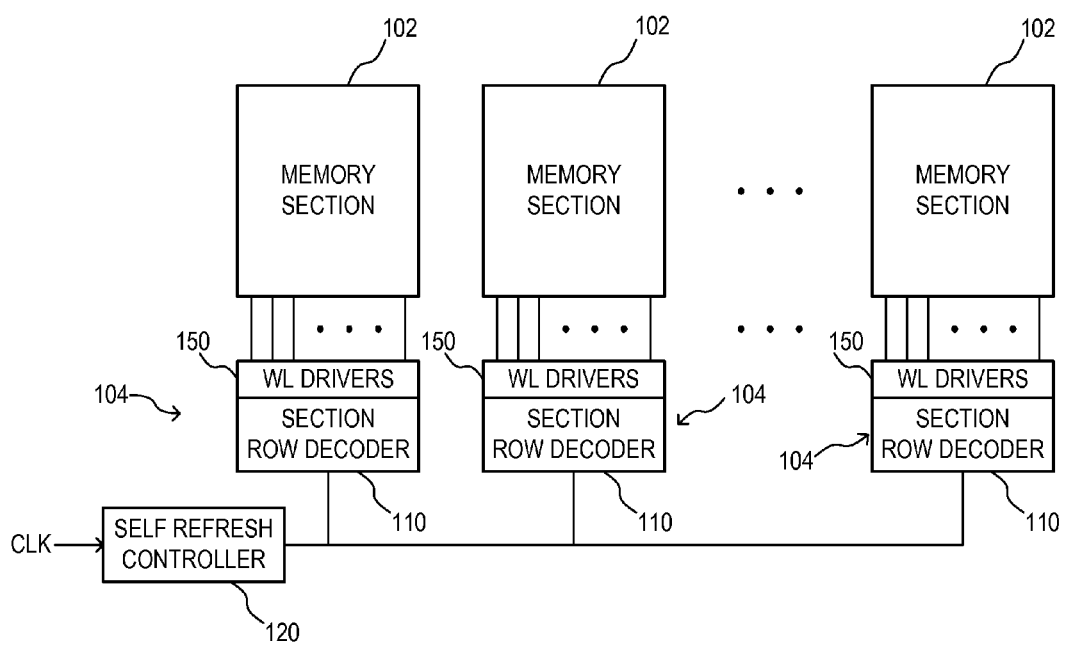
FIG. 1 is a block diagram of a memory bank according an embodiment of the invention.

FIG. 1 illustrates a block diagram for an apparatus in the form of a memory bank 100 according to an embodiment of the invention. The memory bank 100 may include a plurality of memory sections 102 and a corresponding plurality of memory section control circuits 104. Memory sections 102 may each comprise a plurality of rows of memory cells (not shown) that may be accessed by activating corresponding word lines (WLs). The memory section control circuits 104 include a section row decoder 110 as well as a word line driver circuit 150 coupled to the WLs of the corresponding memory section 102. Memory bank 100 further includes a self-refresh controller 120 coupled to each of the plurality of memory section control circuits 104. Self-refresh controller 120 may include an internal clock generator (not shown) or may be provided a clock signal CLK.

In operation, and in particular during a self-refresh operation, individual rows of each memory section are refreshed based on row addresses generated by the self-refresh controller 120. In at least one embodiment, self-refresh controller 120 may generate addresses for all rows of a memory section 102 before generating addresses for rows of a different memory section 102. As a result, all rows of a memory section 102 may be refreshed before any rows of a subsequent memory section 102 are refreshed. Self-refresh through the rows of memory sections may continue until the self-refresh operation is terminated. In some embodiments, row addresses generated by the self-refresh controller 120 may increase sequentially, may decrease sequentially, or may be generated in any other order. For example, row addresses may start at the highest numerical address and decrease until all rows of a memory section have been refreshed, or odd-numbered addresses may be refreshed before, or after, even-numbered addressed are refreshed.

During the period of time in which self-refresh controller 120 is refreshing the rows of a particular memory section 102, that memory section 102 is considered "active" and memory sections 102 not being refreshed are considered "inactive." Moreover, in at least one embodiment, the gates of the nFETs of the word line driver circuits 150 of the inactive memory sections 102 are provided with a common voltage, such as VCC, and the gate of the nFET of a word line driver circuit 150 of the active memory section 102 is provided with a pumped supply voltage, such as VCCP, when a word line of the active section is to be deactivated (where VCCP is further provided to keep word lines of the active section inactive). This can be done by charging a voltage on a node (Vccprdec) of a section row decoder 110 of an active memory section 102 up to VCCP, but allowing the voltage on corresponding nodes of the section row decoders 110 of the inactive memory sections 102 to remain at VCC.

The VCCP voltage provided to the Vccprdec node of a section row decoder 110 of an active memory section 102 may be used by the word line driver circuit 150 of the active memory section 102 to deactivate a WL of the active memory section and/or to keep WLs of the active memory section inactive during refresh. In other words, in the present example, the voltage being provided to the Vccprdec node of a memory section control circuit 104 of the active memory section 102 is not charged or discharged between VCC and VCCP. Meanwhile, VCC is provided to the Vccprdec nodes of the memory section control circuits 104 of the inactive memory sections 102, accordingly, the Vccprdec nodes of the memory section control circuits 104 are also not charged or discharged between VCC and VCCP.

Following the refreshing of the rows of a memory section 102, the memory section 102 becomes inactive and a new memory section 102 becomes active to be refreshed. Part of this transition may involve discharging the Vccprdec node of the memory section control circuit 104 of the newly inactive memory section 102 to VCC, and charging the Vccprdec node of the memory section control circuit 104 of the newly active memory section 102 to VCCP. By altering the voltage provided to a memory section control circuit 104 responsive to the corresponding memory section 102 becoming active or inactive, the voltage provided to such a memory section control circuit 104 need only change once at activation of the memory section 102 and once at deactivation of the memory section 102.

Figure 2:
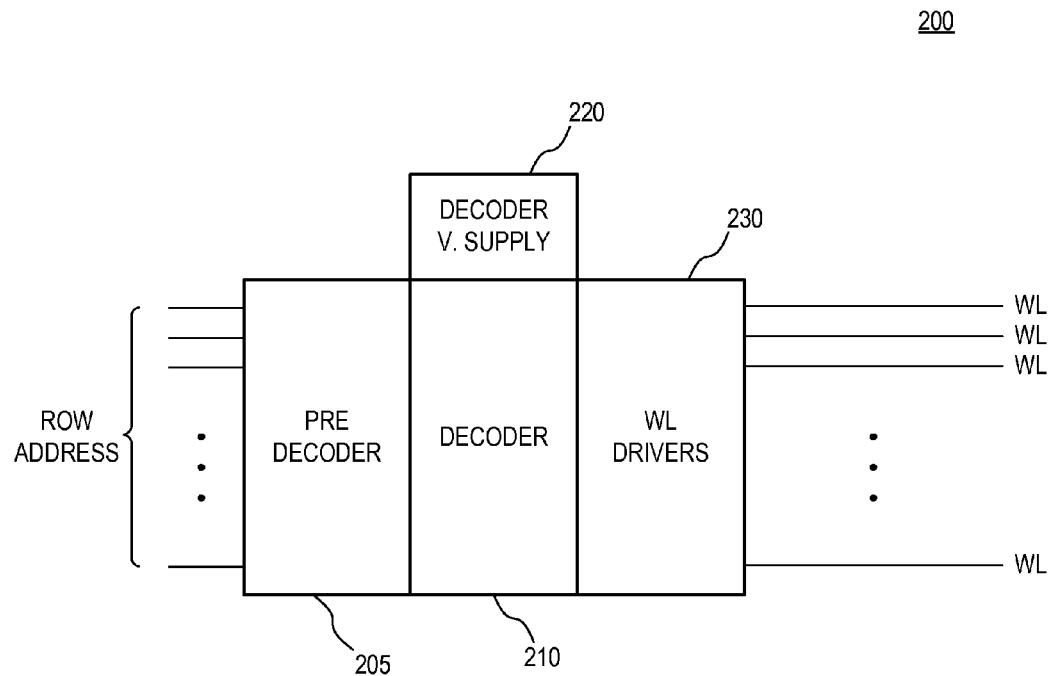
FIG. 2 is a block diagram of a memory section control circuit according to an embodiment of the invention.

FIG. 2 illustrates a block diagram for a memory section control circuit 200 according to an embodiment of the invention. The memory section control circuit 200 may be used for the memory section control circuit 104 in the memory bank 100 of FIG. 1. A decoder 210 may be coupled to a pre-decoder 205, in addition to a decoder voltage supply 220, and a plurality of word line drivers 230. In some embodiments, the pre-decoder 205, the decoder 210, and the decoder voltage supply 220 comprise a section row decoder 110 of FIG. 1. The plurality of word line drivers 230 are coupled to a plurality of WLs of a memory section.

The pre-decoder 205 is provided undecoded row addresses via a row address bus. The undecoded row addresses may be provided over the address bus during execution of memory commands (e.g., reads, writes, etc.). The undecoded row addresses may also be provided by a self-refresh controller, for example, the self-refresh controller 120 illustrated in FIG. 1, during a self-refresh operation. The pre-decoder 205 may, among other things, decrease the "fan-in" resulting from the input of the undecoded row addresses. The pre-decoder 205 is configured to partially decode the undecoded row addresses and provide pre-decoded row addresses to the decoder 210. The decoder 210 is further selectively provided either the VCC voltage or the VCCP voltage by a decoder voltage supply 220. For example, the decoder voltage supply 220 for an active memory section provides the VCCP voltage to a Vccprdec node of decoder 210 while the decoder voltage supply 220 for inactive memory sections provides the Vccprdec nodes of respective decoders 210 a voltage other than VCCP, for example, the VCC voltage.

In operation, the decoder 210 of an active memory section decodes the pre-decoded row addresses from the pre-decoder 205, and based at least in part on the pre-decoded row addresses, provides particular one(s) of the plurality of word line drivers 230 the VCCP voltage to deactivate a respective word line or to keep the word lines of the section inactive pending refresh. The decoders 210 of inactive memory sections, however, are provided the VCC voltage to keep the word lines of those section inactive.

Figure 3:
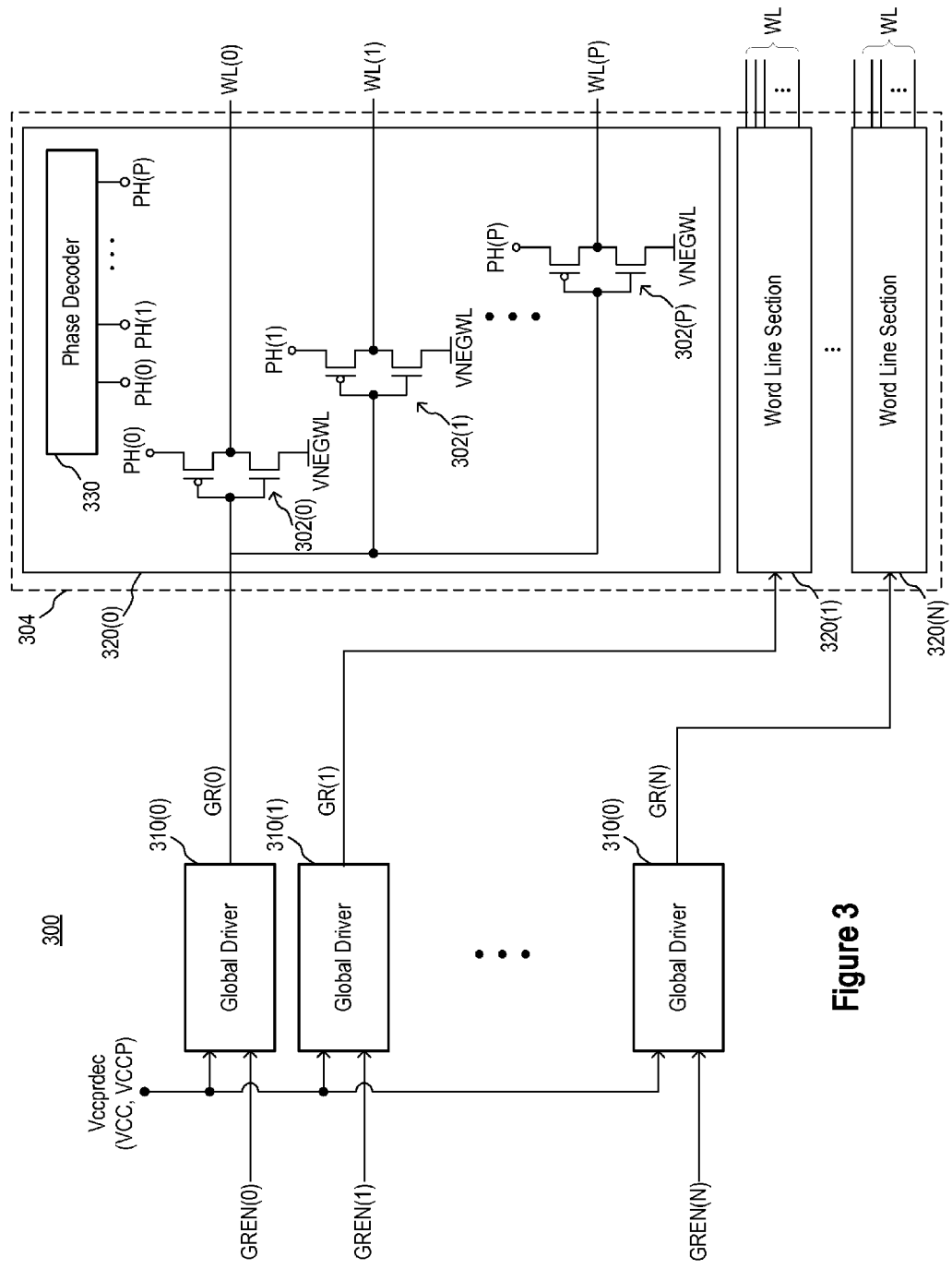
FIG. 3 is a schematic diagram for a global driver and word line drivers according to an embodiment of the invention.

FIG. 3 illustrates a block diagram of portions of a decoder 300 and word line drivers 304 according to an embodiment of the invention. The decoder 300 includes global drivers 310(0)-310(N) coupled to word line sections 320(0)-320(N) of the word line drivers 304 of a memory section. Each of the word line sections 320 includes word line drivers 302(0)-302(P), each of which being coupled to a respective WL, and further includes a phase decoder 330 coupled to each of the word line drivers 302(0)-302(P) to provide a respective PH signal. Each of the global word line drivers 310(0)-310(N) provides word line drivers 302 of a respective word line section 320 a respective global row signal GR(0)-GR(N). Either the VCC voltage or the VCCP voltage is selectively provided to an input node (Vccprdec) of the global drivers 310(0)-310(N) of a memory section by a decoder voltage supply 220 responsive to whether that memory section has been selected (or not selected) for activation. A respective global row enable signal GREN(0)-GREN(N) is also provided to each of the global drivers 310(0)-310(N) of a memory section.

Each word line driver 302 may include a p-channel field effect transistor (pFET) and a n-channel field effect transistor (nFET). The pFET and nFET are coupled at their respective drains to form an output stage coupled to a respective word line WL. Gates of the pFETs and nFETs of the word line drivers 302 of a word line section are configured to receive a GR signal from the respective global driver 310. The source of the pFET of each word line driver 302 is configured to receive a respective phase signal PH from the phase decoder 330, and the source of the nFET of each word line driver 302 is configured to receive a deactivated word line voltage VNEGWL (where a WL may be deactivated by coupling it to the VNEGWL voltage).

An active GREN signal (e.g., having a signal level of VCCP) is provided to a selected global driver 310(0)-310(N) of an active memory section, for example, the global driver 310(0) providing the GR(0) signal to the word line section 320(0). According to the present example, an active GREN(0) signal causes the GR(0) signal to be at a sufficiently low level (e.g., ground) to turn on the pFETs of the word line drivers 302 of word line section 320(0). The activation of a particular GREN signal may be based on the row addresses and provided by logic included in the pre-decoders and/or decoders of the memory section control circuit(s). Inactive GREN signals are provided to the other global drivers 310 (e.g., global driver 310(1)-310(N)) in the active memory section, thereby causing the corresponding GR signals (e.g., GR(1)-GR(N) to be at a sufficiently high level (e.g., VCCP) to quickly turn on the nFETS of the word line drivers 302 of the word line sections 320(1)-320(N) of the active memory section. In an inactive memory section, the signals GREN(0)-GREN(N) may be at a sufficiently low voltage to cause all of the signals GR(0)-GR(N) of those sections to be at VCC, thereby keeping all of the word lines of those sections inactive, while reducing power consumption in those sections due to GIDL currents (e.g., as compared to if the signals GR(0)-GR(N) of those sections were instead at VCCP).

As described above, during a self-refresh operation, a self-refresh controller may generate row addresses to refresh rows of a plurality of memory sections. That is, addresses generated by the self-refresh controller may be decoded by pre-decoders and/or decoders of the memory section control circuits, and a row corresponding to the decoded address is refreshed. The memory section including the row corresponding to the refresh address is made active so that the memory may be refreshed.

When a memory section becomes active, the VCCP voltage is provided to the global drivers 310 of the active memory section. Also, as previously discussed, in the active memory section an active GREN signal (e.g., at VCCP) is provided to the global driver 310 of the word line section 320 that includes the row of memory to be refreshed. Inactive GREN signals (e.g., at ground) are provided to the other global drivers 310 of the active memory sections. As a result, GR signals having the VCCP voltage are provided to respective word line sections 320 of the active memory section to couple the WLs of those sections 320 to the VNEGWL voltage through the nFET of the word line drivers 302 of those word line sections 320. The global driver 310 provided the active GREN signal, however, provides a GR signal having a sufficiently low voltage (e.g., ground) to cause the pFETs of the word line drivers 302 for that word line section 320 to be conductive. The phase decoder 330 provides a PH signal having the VCCP voltage to the word line driver 302 coupled to the WL of the row to be refreshed (the PH signals provided by the phase decoder 330 to the other word line drivers 302 of that section may be at a voltage that is too low to activate their word lines). As the row addresses change, so do the voltages of the PH signals, where the VCCP voltage is provided to the word line driver 302 coupled to the WL of whichever row is to be refreshed, and a voltage too low to activate a word line (e.g., ground) is provided to the other word line drivers 302 of the word line section 320.

As the row addresses continue to change (e.g., increment), when the rows of a word line section 320 have been refreshed, the GREN signal for the corresponding global driver 310 becomes inactive and the GREN signal for the global driver 310 of another word line section 320 becomes active. The process of refreshing the rows of an active word line section 320 as previously described can be repeated until the rows have been refreshed or the self-refresh operation is terminated. Similarly, the global drivers 310 can be made active and inactive until all of the rows of the active memory section are refreshed or the self-refresh operation is terminated.

In contrast to an active memory section, the global drivers 310 for the inactive memory sections are provided the VCC voltage to drive a GR signal having the VCC voltage to the word line drivers 302 of the word line sections 320. Additionally, the PH signals provided to the word line drivers 302 of the inactive memory sections are at a voltage that is too low to activate the word lines of those sections. With the global drivers 310 providing VCC to the word line drivers 302 of the inactive memory sections, the WLs of those sections are coupled to the VNEGWL voltage to keep the WLs of those sections in an inactive state.

Once all rows of an active memory section have been refreshed, the memory section may transition to an inactive state. The global drivers 310 of the newly inactive memory section are provided the VCC voltage rather than the VCCP voltage to drive the GR signals. A new memory section may become active as the row addresses continue to change and correspond to the rows of memory in the new memory section. The newly active memory section is provided the VCCP voltage rather than the VCC voltage to drive the GR signals.

The use of the VCC voltage for driving the GR signal in the inactive memory sections may decrease leakage currents (e.g., GIDL currents) in comparison to providing a GR signal having the VCCP voltage. The VCC voltage is typically lower than the VCCP voltage. The VCC voltage may have a magnitude so as to reduce gate-induced diode leakage (GIDL) in word line drivers 302 of inactive memory sections. That is, by supplying each word line driver 302 of the inactive memory sections with the VCC voltage, the gate-to-drain voltage $V_{GD}$ of the pFET is maintained at a relatively low level, resulting in a lower GIDL current and power consumption.

While GIDL currents could be further reduced in an active memory section by only providing the VCCP voltage to a word line driver 302 of the active section when needed to close its respective row, providing the VCCP voltage to only a single row at any time could require charging and discharging of the GR signals between the VCCP and VCC voltages for each of the WLs. The cycle of charging and discharging during a self-refresh operation essentially wastes current. As a result, maintaining the VCCP voltage during an entire time a memory section is active, for example, during self-refresh, may reduce power consumption in comparison to switching between the VCC and VCCP voltages for each row during self-refresh.

Figure 4:
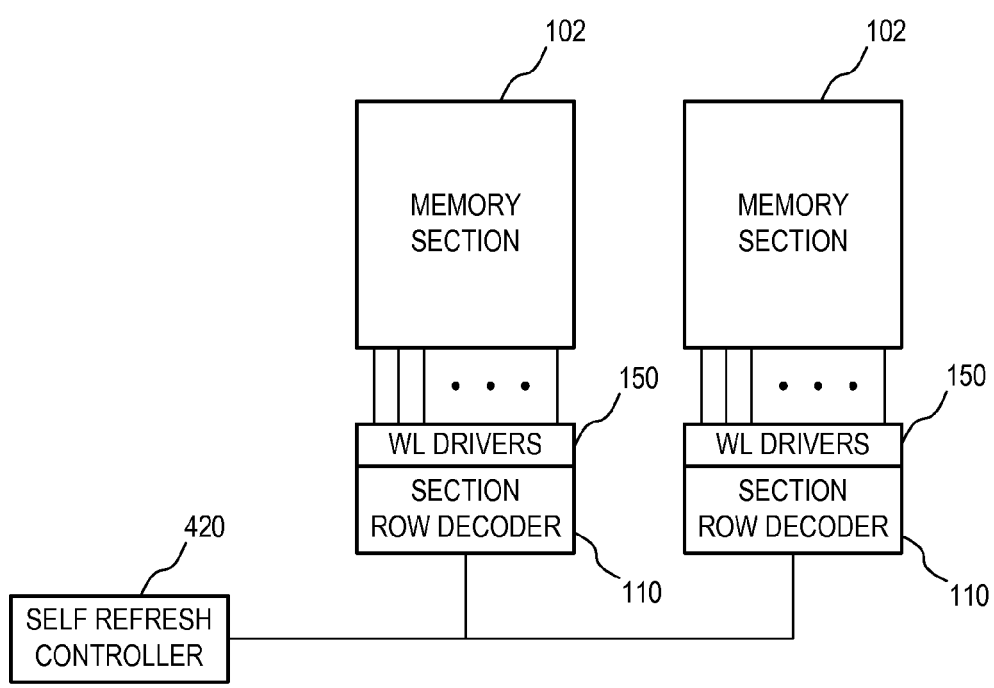
FIG. 4 is a block diagram of a memory bank according to an embodiment of the invention.

In at least one embodiment, multiple memory sections may be active simultaneously to allow for interleaved memory section row refreshes. For example, FIG. 4 illustrates a block diagram of a portion of a memory bank 400 according to an embodiment of the invention. Although two memory sections 102 are illustrated in FIG. 4, the memory bank 400 may include additional memory sections 102 and memory section control circuits 110. Additional memory sections and memory section control circuits have not been shown to simplify FIG. 4 for the following discussion. Much of the components of the memory bank 400 are the same as those of the memory bank 100. Thus, in the interest of brevity, those components of the memory bank 400 are labeled with the same numeric references as the corresponding components in the memory bank 100, and the description of which will not be repeated. The memory bank 400, however, includes a self-refresh controller 420. Self-refresh controller 420 is coupled to the memory section control circuits 110.

In operation, self-refresh controller 420 may provide row addresses such that rows of multiple memory sections are refreshed in an interleaved manner. In other words, rows of a group of memory sections 102 may be refreshed during the same period of time before another group of memory sections is activated and its rows refreshed. In some embodiments, each memory section in a group may refresh one row at a time, or memory sections may alternate refreshing multiple rows at a time before rows in another active memory section of the group is refreshed. Moreover, rows of each section may be refreshed in the same order, or may be refreshed in different orders.

For example, self-refresh controller 420 may generate addresses such that a first memory section 102 and a second memory section 102 are simultaneously active and alternate refreshing rows one at a time. That is, refreshing of a first row in the first memory section 102 may be initiated, and then refreshing of a row in the second memory section 102 may be initiated before initiating refresh of a second row in the first memory section 102. During the interleaved refreshing process, both memory sections may remain active until each memory section has refreshed all respective rows. The global word line drivers (not shown) of the active memory sections are provided the VCCP voltage to provide respective GR signals having the VCCP voltage throughout the active period while the inactive memory sections are provided the VCC voltage to provide GR signals having the VCC voltage. A new group of memory sections may subsequently be activated and the rows of the newly active memory sections refreshed in an interleaved manner.

It will be appreciated by those having ordinary skill in the art that the number of memory sections that may be activated simultaneously is not limited by particular example provided herein and that any number of memory sections may be included in a group to refresh the rows in an interleaved manner. Interleaving the refreshing of rows for a group of memory sections may be desirable to allow a row to have a longer time to refresh before switching to a new row in the same memory section, while shortening the overall time for refreshing the rows of all the memory sections in a group.

As previously discussed, global drivers and word line drivers of an active memory section may be provided the VCCP voltage to refresh the rows of memory (e.g., to close an active row and to keep inactive rows inactive; a different voltage, such as ground, is provided to selected word line drivers of an active memory section to refresh the word lines corresponding to those drivers), whereas global drivers of inactive memory sections are provided with the VCC voltage to drive the word line drivers with the VCC voltage. Using a reduced VCC voltage for the inactive memory sections may reduce power consumption resulting from leakage currents. Where multiple memory sections of a group are active for interleaved refreshing, each of which uses the VCCP voltage during refresh, there will be greater power consumption compared to having one memory section active at a time. However, the additional power consumption from having multiple memory sections active over having one active memory section may be nonetheless acceptable given that power savings may still result from the inactive sections using the VCC voltage rather than the VCCP voltage.

Figure 5:
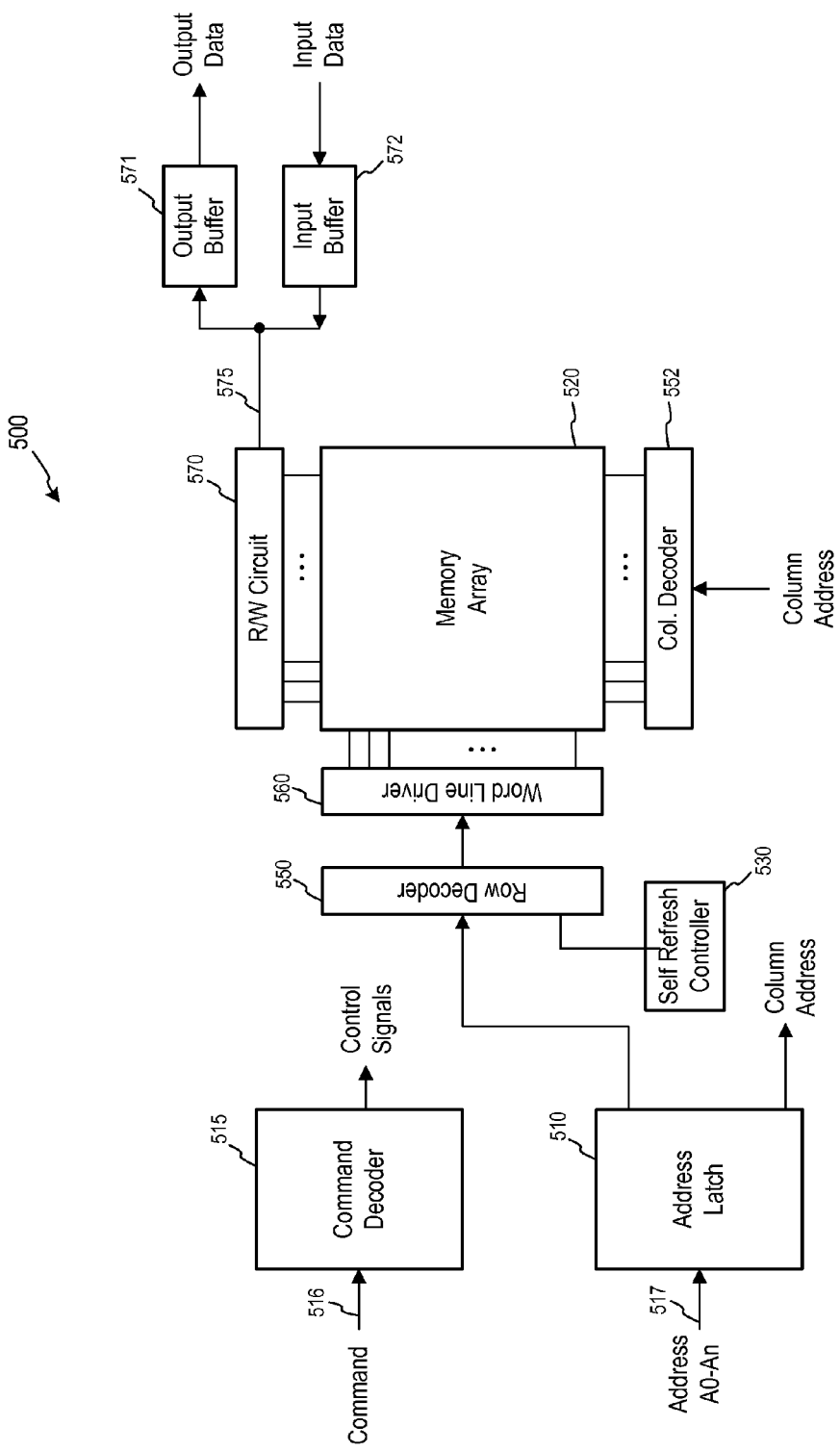
FIG. 5 is a block diagram of a memory including a memory section control circuit according to an embodiment of the invention.

FIG. 5 illustrates a portion of an apparatus in the form of a memory 500 according to an embodiment of the invention. The memory 500 includes a memory array 520 of memory cells. The memory cells of memory array 520 may be DRAM memory cells. In other embodiments, memory cells may be SRAM memory cells, flash memory cells, or other types of memory cells known by those having ordinary skill in the art. The memory 500 may be used in another apparatus, such as a computing system.

The memory 500 may receive commands at a command decoder 515 via command bus 516 and generate corresponding control signals. For example, the command decoder 515 is used to generate internal control signals to read data from and write data to the memory array 520. Row and column address signals may be provided to the address latch 510 via an address bus 517, which subsequently may output row and column addresses to the row address decoder 550 and the column address decoder 552. The column address decoder 552 selects bit lines extending through the array 520 corresponding to respective column addresses. The row address decoder 550 is connected to word line driver 560 that activates respective rows of memory cells in the array 520 corresponding to received row addresses. The selected data line (e.g., a bit line or bit lines) corresponding to a received column address are coupled to a read/write circuitry 570 to provide read data to a data output buffer 571 via an input-output data bus 575. Write data is applied to the memory array 520 through a data input buffer 572 and the memory array read/write circuitry 570. During a self-refresh operation, row address decoder 550 may instead receive row addresses from a self-refresh controller 530. Self-refresh controller 530 may be configured to generate row addresses, and may be implemented using the self-refresh controller 120 or self-refresh controller 420 illustrated in FIGS. 1 and 4, respectively.

The row address decoder 550 may be coupled to a word line driver 560 and provide word line driver 560 with decoded row address signals. Word line driver 560 may in turn be configured to activate respective rows of memory cells in the array 520 corresponding to the decoded address signals. In at least one embodiment, the row decoder 550 may include one or more of the decoders 210 of FIG. 2 and the word line driver 560 may include one or more of the word line drivers 230 of FIG. 2.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An apparatus, comprising:
a memory section control circuit coupled to a memory section, the memory section control circuit configured to provide a first voltage to the memory section while the memory section is active during a self-refresh operation and to selectively provide the second voltage to the memory section while the memory section is inactive during the self-refresh operation.

2. The apparatus of claim 1, further comprising a self-refresh controller configured to provide an address to the memory section control circuit.

3. The apparatus of claim 2, wherein, while the memory section is active, the memory section control circuit is configured to refresh memory corresponding to the address responsive to receiving the address.

4. The apparatus of claim 2, wherein the memory section control circuit comprises a decoder configured to decode the address from the self-refresh controller.

5. The apparatus of claim 1, wherein the memory section control circuit comprises a plurality of access line driver circuits, wherein, while the memory section is inactive, the plurality of access line driver circuits are configured to receive a third voltage, and wherein, while the memory section is active, an access line driver circuit of the plurality of access line driver circuits is configured to receive a fourth voltage.

6. The apparatus of claim 5, wherein the fourth voltage is greater than the third voltage.

7. The apparatus of claim 1, further comprising the memory section.

8. An apparatus, comprising:
a memory comprising a first section and a second section, wherein, during a self-refresh operation, the first section and the second section are concurrently active for a self-refresh of each of the first section and the second section, the memory further comprising a plurality of additional memory sections that are inactive during the self-refresh operation.

9. The apparatus of claim 8, wherein the first section and the second section are configured to receive a first voltage while active, and wherein the plurality of memory sections are configured to receive a second voltage while active, wherein the first voltage is greater than the second voltage.

10. The apparatus of claim 8, wherein a row of the first section is concurrently refreshed with a row of the second section during the self-refresh operation.

11. The apparatus of claim 8, wherein refresh of individual rows of the first section is alternated with refresh with individual rows of the second section.

12. The apparatus of claim 8, further comprising a self-refresh controller configured to provide first addresses to the first section and to provide second addresses to the second section.

13. The apparatus of claim 12, wherein the self-refresh controller configured to provide the first addresses in a descending order to the first section and to provide second addresses in an ascending order to the second section.

14. The apparatus of claim 12, wherein the self-refresh controller is configured to provide the first addresses to the first section in a same order as the second addresses are provided to the second section.

15. The apparatus of claim 8, wherein the first section and the second section are transitioned to inactive responsive to completion of the self-refresh operation for both the first section and the second section.

16. A method, comprising:
activating a first section and a second section of a memory during a self-refresh operation for a self-refresh of each of the first section and the second section; and
deactivating a remaining plurality of sections of the memory during the self-refresh operation.

17. The method of claim 16, further comprising refreshing rows of the first section concurrently with rows of the second section during the self-refresh operation.

18. The method of claim 16, further comprising alternating refresh of rows of the first section with rows of the second section during the self-refresh operation.

19. The method of claim 16, further comprising refreshing rows of the first section in a different order than refreshing rows of the second section during the self-refresh operation.

20. The method of claim 16, further comprising deactivating the first section and the second section responsive to completion of the self-refresh operation for the first section and the second section.

\* \* \* \* \*